(12) United States Patent
Correll et al.

(10) Patent No.: US 8,379,398 B2
(45) Date of Patent: Feb. 19, 2013

(54) DIN RAIL MOUNTABLE BASE FOR PROCESS FIELDBUS REDUNDANT POWER CONDITIONER

(75) Inventors: Michael Anthony Correll, Hershey, PA (US); Terry Lee Barber, Harrisburg, PA (US)

(73) Assignee: Phoenix Contact Development & Manufacturing, Inc., Middletown, PA (US)

( * ) Notice: Subject to any disclaimer, the term of this patent is extended or adjusted under 35 U.S.C. 154(b) by 118 days.

(21) Appl. No.: 13/069,527

(22) Filed: Mar. 23, 2011

(65) Prior Publication Data

US 2012/0243190 A1 Sep. 27, 2012

(51) Int. Cl.
*H05K 5/00* (2006.01)
(52) U.S. Cl. .......................... 361/756; 361/802; 361/741
(58) Field of Classification Search .................. 361/727, 361/741, 756, 802, 792; 700/21, 79; 455/91, 455/127.1; 439/110, 532, 716, 717; 710/1, 710/8, 11, 100, 62, 65, 69, 33
See application file for complete search history.

(56) References Cited

U.S. PATENT DOCUMENTS

| 4,401,351 | A |   | 8/1983 | Record |
| 5,249,979 | A | * | 10/1993 | Deinhardt et al. ............ 439/341 |
| 5,472,347 | A |   | 12/1995 | Nordenstrom et al. |
| 5,641,313 | A |   | 6/1997 | Hohorst |
| 5,775,955 | A | * | 7/1998 | Graube et al. ................ 439/717 |
| 6,020,867 | A | * | 2/2000 | Shimada et al. ............... 345/87 |
| 6,425,770 | B1 |   | 7/2002 | Lostoski et al. |
| 6,654,255 | B2 | * | 11/2003 | Kruse et al. ................... 361/799 |
| 6,802,737 | B2 | * | 10/2004 | Bergner et al. .............. 439/532 |

FOREIGN PATENT DOCUMENTS

| DE | 20108460 | 11/2001 |
| EP | 1029389 B1 | 9/2001 |

* cited by examiner

*Primary Examiner* — Hung S Bui
(74) *Attorney, Agent, or Firm* — Hooker & Habib, P.C.

(57) ABSTRACT

A modular DIN rail mounted base includes a two-part body made of plastic shells and a unitary circuit board assembly having two vertically spaced circuit boards. The edges of the circuit boards fit into interior grooves formed the interior surfaces of the shells to locate the assembly vertically in the shell. An alignment rib provided in a groove in a shell extends into a recess formed in a circuit board edge in the groove to locate the assembly longitudinally along the groove in the body.

22 Claims, 9 Drawing Sheets

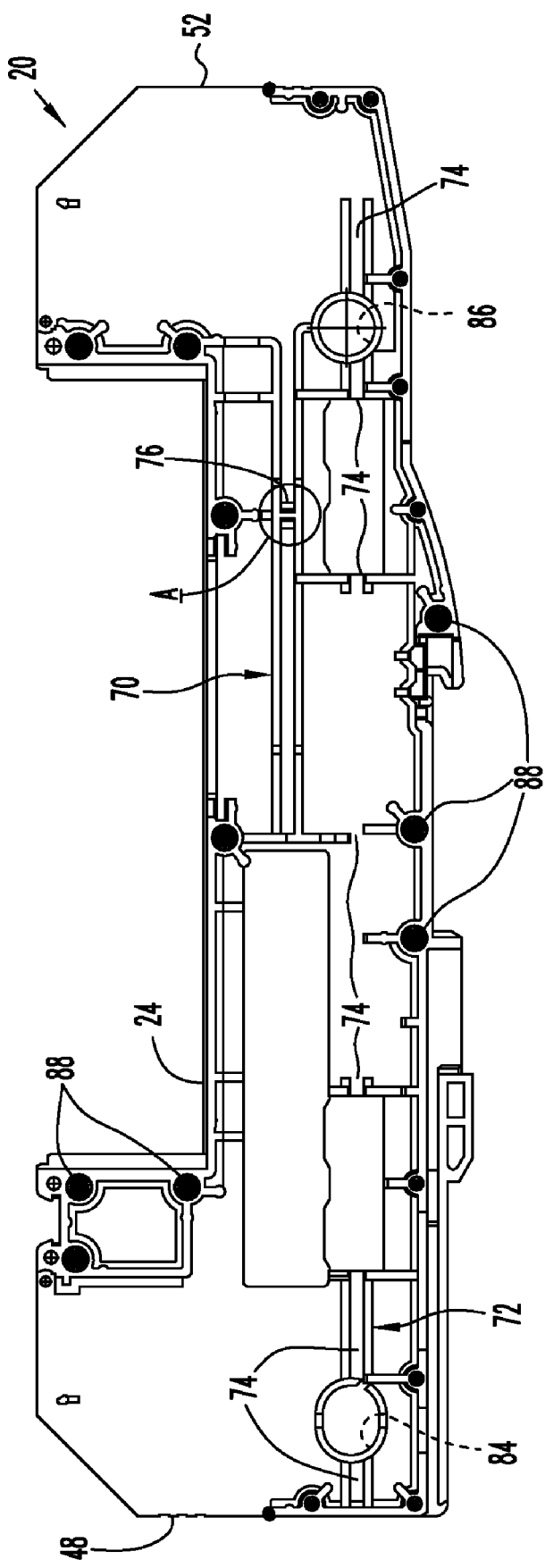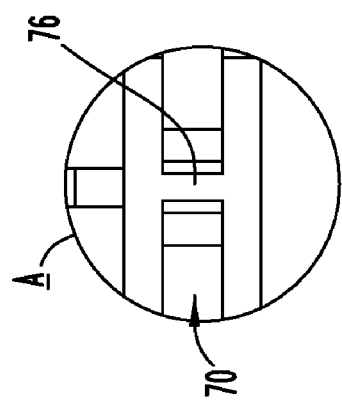
FIG. 5
FIG. 6

DIN RAIL MOUNTABLE BASE FOR PROCESS FIELDBUS REDUNDANT POWER CONDITIONER

FIELD OF THE INVENTION

The invention relates to a power conditioning base that provides redundant, isolated and conditioned power to a two-wire process fieldbus network consisting of one or more host devices (distributed control systems), sensors and/or actuators.

BACKGROUND OF THE INVENTION

Conventional, power conditioning bases process for fieldbuses are stacked together and mounting on a DIN rail. A power bus extends through the bases and is connected to a remote power source to supply power to each base for operating the fieldbuses.

Each base has a hollow plastic body and electronic components in the body. The components in the body make electrical connections with exterior components, including power modules, fieldbus wiring, power leads and adjacent bases mounted on the DIN rail.

There is a need for a compact process fieldbus base in which circuit components are fitted closely together in proper positions for making electrical connections with exterior components.

BRIEF SUMMARY OF THE INVENTION

The disclosed base provides mounting and connectivity for two power isolation modules. The base has field-wired terminal blocks for two power buses, two host devices, one trunk line for sensors and actuators, a relay alarm loop, and earth ground; docking connectors to receive two power isolation modules; and card-edge connections for power bus and relay alarm loops that provide power and alarm busing between adjacent bases. The field-wired terminal blocks are pluggable for ease of wiring. The power isolation modules may be swapped during live operation (hot-swappable) which allows one module at a time to be replaced without compromising the operation of the process fieldbus network. Bridging connectors may be installed on the card edge power and relay alarm connections between bases to provide ease of wiring of bulk DC power and relay alarm loops in installations consisting of multiple bases and process fieldbus networks.

The base consists of a hollow, plastic body which houses a two-circuit board assembly. Electrical components and field-wired terminal blocks are mounted on the circuit board assembly. Additionally, the base provides a mechanism for mating and un-mating the base to a DIN rail, and a means for mounting plastic markers which may be used by the user to label each Process Fieldbus network.

The edges of the circuit boards in the circuit board assembly fit into interior grooves formed on the interior surfaces of the shells to locate the assembly vertically in the body. An alignment rib provided in a groove in a shell extends into a recess formed in a circuit board edge in the groove in order to locate the entire assembly longitudinally in the body. Use of alignment grooves and a rib to locate the assembly in the body permits very dense and accurate location of the components on the assembly. This assures that the base is compact and that electrical components on the circuit board assembly are properly located, for forming electrical connections with exterior components.

BRIEF DESCRIPTION OF THE DRAWINGS

FIG. 5 is a view taken along line 5-5 of FIG. 4;

FIG. 6 is an enlarged view of portion A of FIG. 5;

DESCRIPTION OF THE PREFERRED EMBODIMENT

Figure 1:
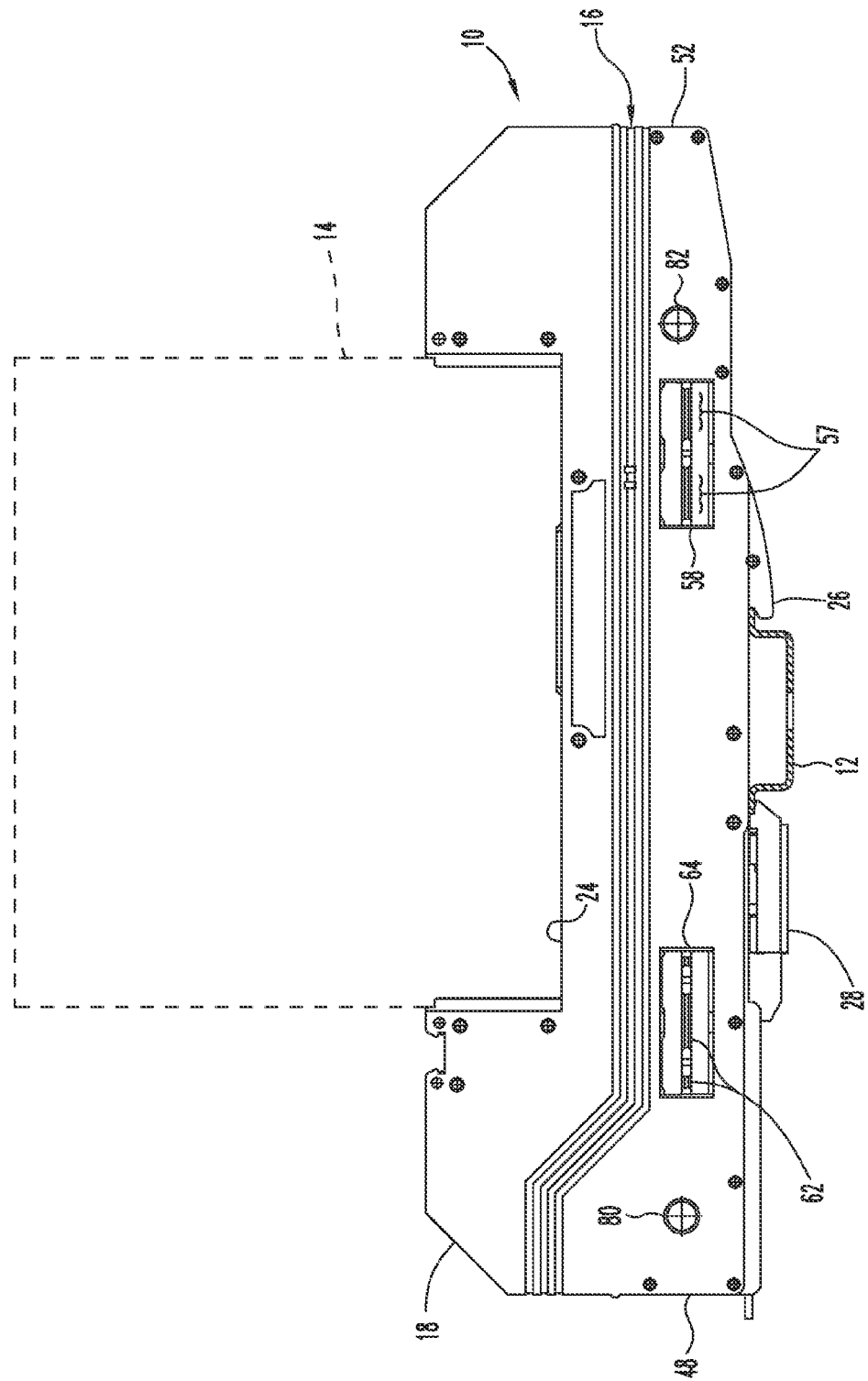
FIG. 1 is a side view of a base mounted on a DIN rail.
Figure 2:
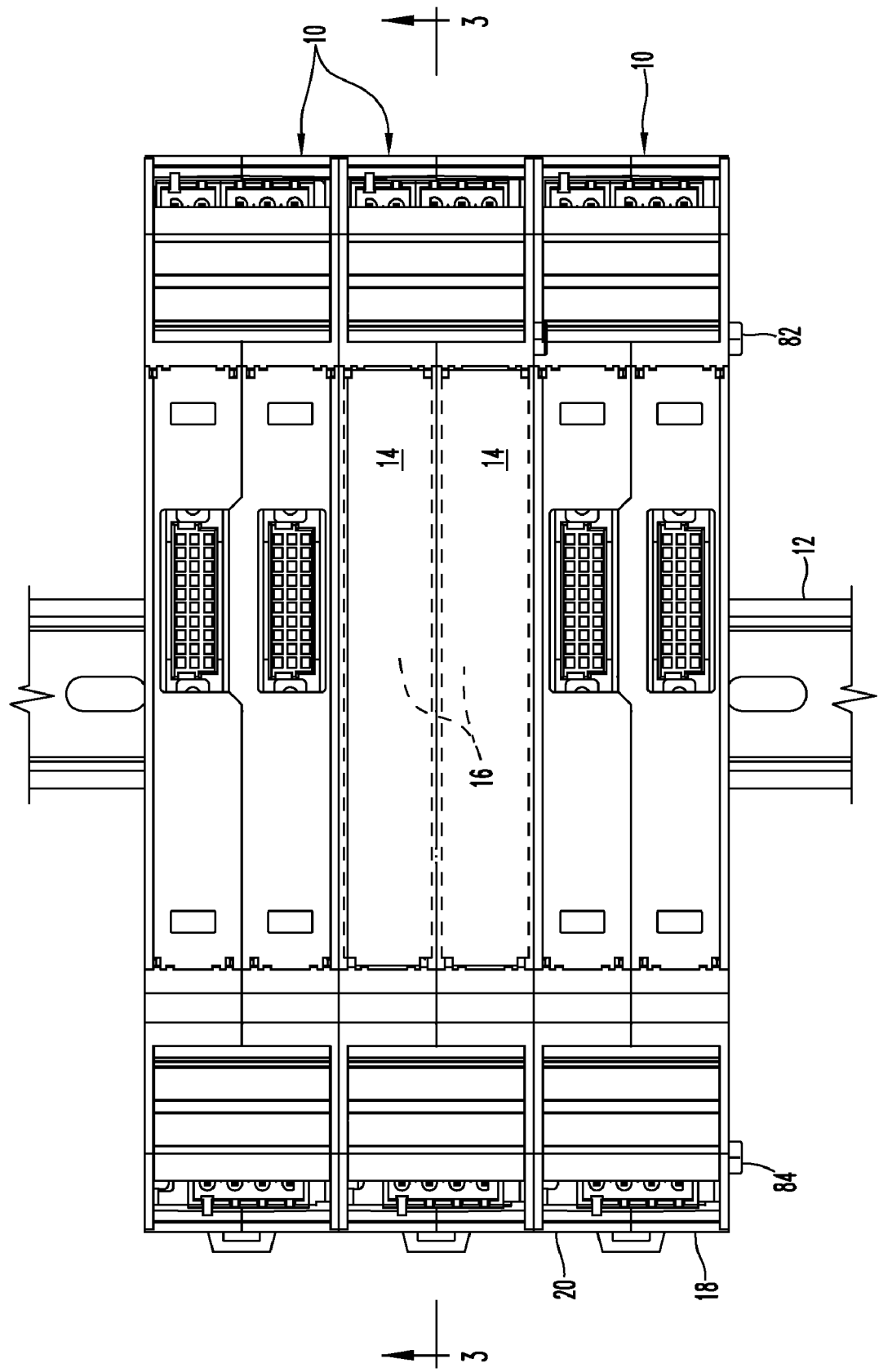
FIG. 2 is a top view of three bases mounted on a DIN rail.

FIGS. 1 and 2 illustrate like process fieldbus bases 10 mounted on DIN rail 12. Two isolation modules 14 are removably mounted on each base 10. Isolation module 14 is shown representationally in FIG. 1.

Each base 10 includes a hollow plastic body 16 formed by joining together molded plastic shells 18 and 20. Unitary circuit board assembly 22 is accurately located in the interior of body 16 between shells 18 and 20. Body 16 defines an upwardly facing module recess 24 for receiving two side-by-side isolation modules 14. DIN rail hook 26 and DIN rail latch 28 are provided on the bottom of each base 10 to permit removable attachment of bases 10 on rail 12.

Circuit board assembly 22 includes an elongate lower circuit board 30 which extends the interior length of body 16 and a shorter upper circuit board 32 spaced a short distance above board 30 and located under recess 24. Circuit board 32 is mounted on circuit hoard 30 by two spacer fasteners 34 at one end of board 32 and a single spacer fastener 36 at the opposite end of board 32. Board 32 supports two side-by-side multi-contact electrical connectors 38 with upper ends which open into module recess 24 through openings 40 and 42 in shells 18 and 20. Terminal tails 44 extend down from connectors 38 to pads on board 30.

Figure 10:
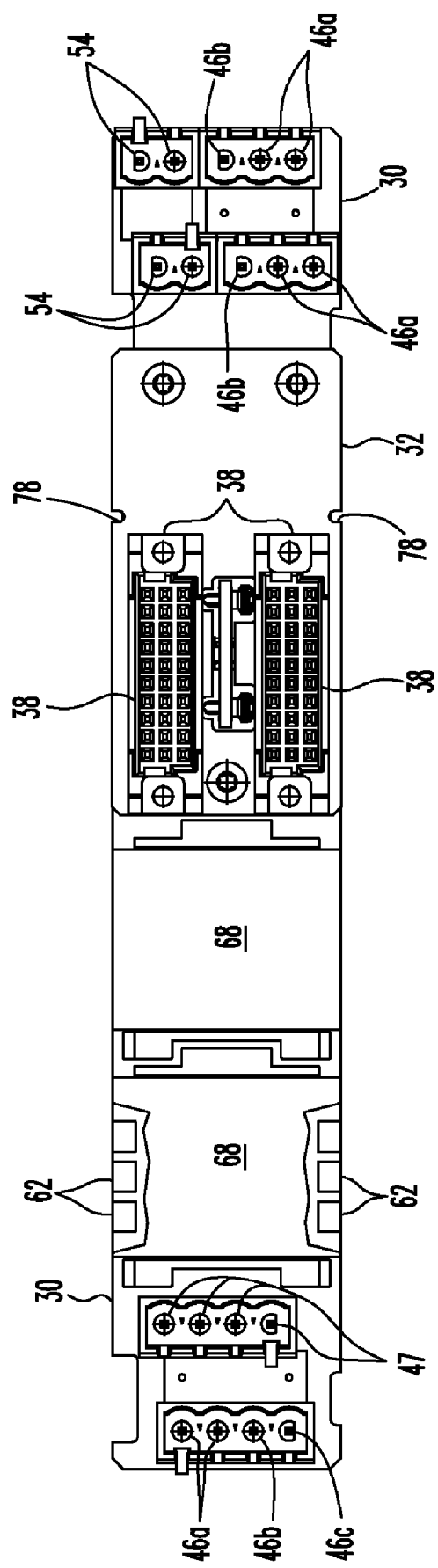
FIG. 10 is a top view of FIG. 8.

As shown in FIG. 10, connections to the main trunk of the process fieldbus network occurs on terminals 46a. Connection of a cable shield, occurs on terminal 46b. Optional connection to earth ground occurs on terminal 46c. Input and output connections to the relay alarm loops as well as power isolation module bypass connections are provided by terminals 47. Two pairs of power contact pins 54 are mounted on the right end of board 30 shown in FIG. 10.

Figure 9:
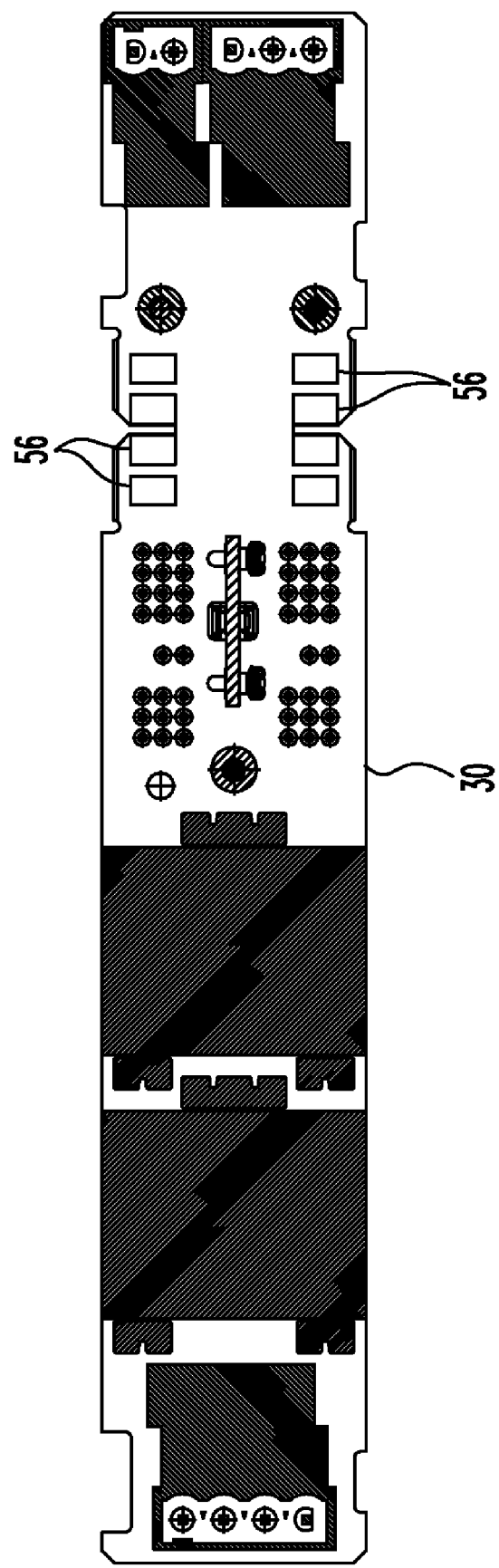
FIG. 9 is a sectional view taken along line 9-9 of FIG. 8.

Two pairs of power contact pads 56 are provided on each side of lower board 30 with connecting circuit paths. See FIG. 9. The power contact pads 56 on adjacent assemblies are connected by conventional bridging connectors (not shown) to form two power buses 57 extending along the stacked bases. Each power bus is connected to a pair of power pins 54 in each base 10. The pads 56 are located inwardly of openings 58 and 60 in shells 18 and 20.

Two relay contact pads 62 are provided on each side of board 30 adjacent pins 46 for forming an alarm circuit loop extending through adjacent bases 10 mounted on DIN rail 12 by use of bridging connectors (not shown). The pads 62 are located inwardly of openings 64 and 66 in shells 18 and 20.

Two decoupling inductors 68 are mounted on the top of lower board 30 between pins 47 and upper circuit board 32. The power buses 57 are connected through isolation modules 14 and inductors 68 to pins 46.

Figure 7:
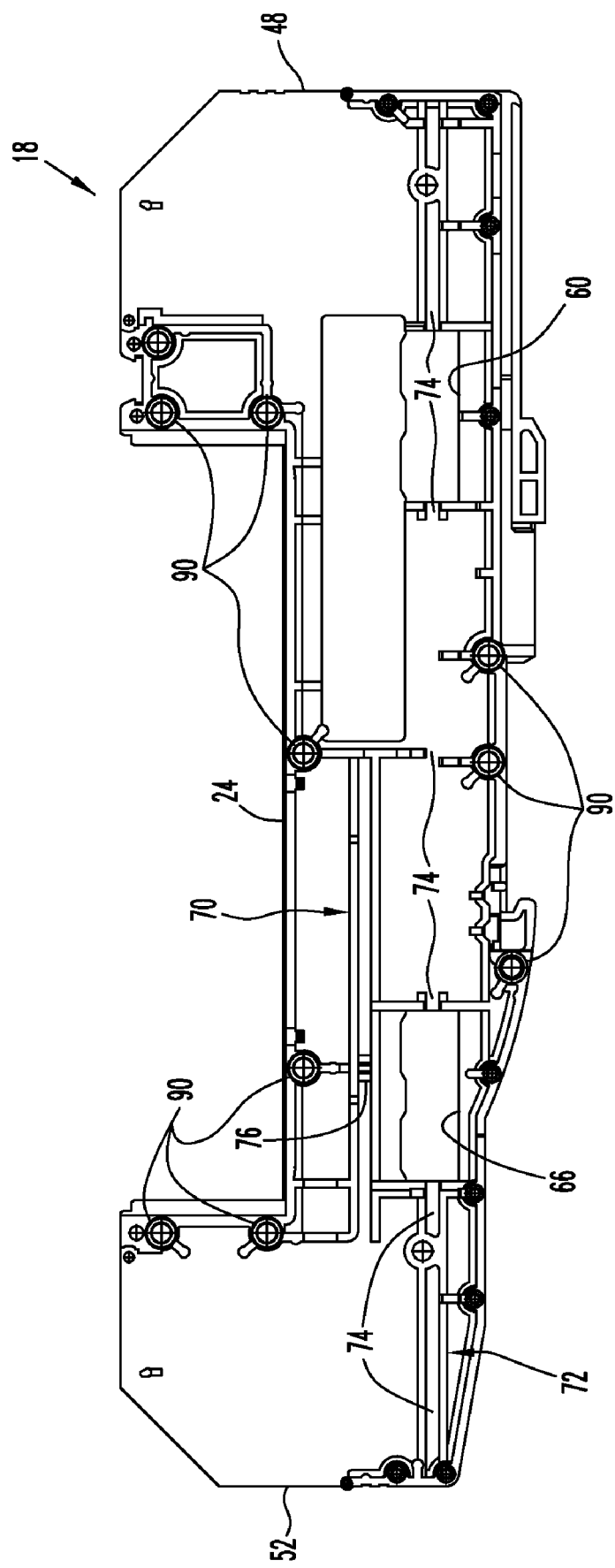
FIG. 7 is a view taken along line 7-7 of FIG. 4.
Figure 8:
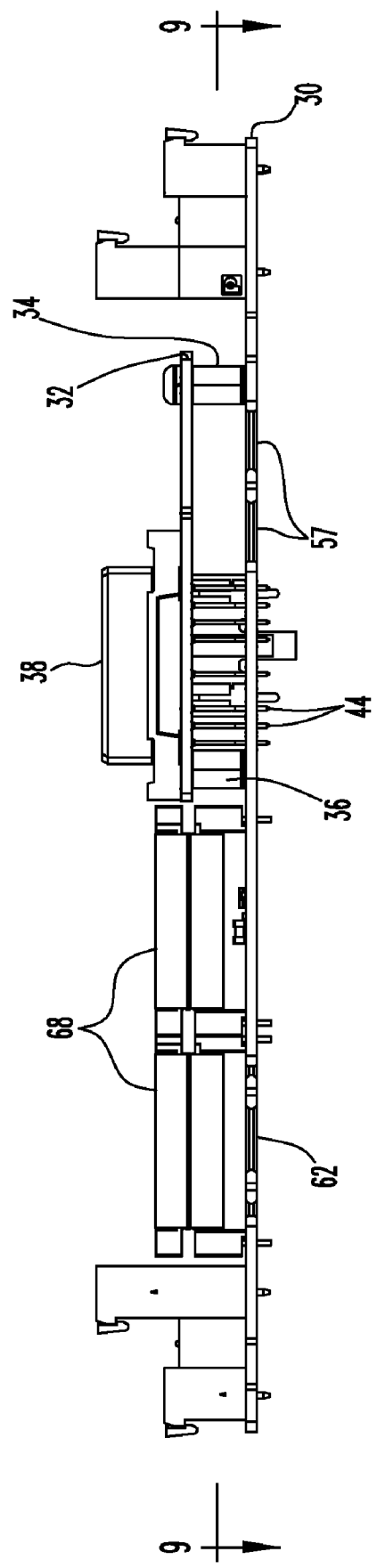
FIG. 8 is a side view of the circuit board assembly taken along line 8-8 of FIG. 4.

FIGS. 5 and 7 illustrate the interior sidewalls of shells 20 and 18, respectively. The interior sidewall of each shell 18, 20 includes a horizontal upper circuit hoard groove 70 located below recess 24, adjacent end 52. A horizontal lower circuit board groove 72, located below groove 70, extends between ends 48 and 52 and includes a number of spaced groove segments 74.

Two opposed alignment projections or ribs 76 are provided in upper grooves 70. See FIGS. 5, 6 and 7. The ribs 76 fit into recesses 78 on the opposite edges of upper circuit board 32 when the circuit board assembly 22 is mounted in plastic body 16 to locate the circuit board assembly 22 longitudinally in the body.

Spaced interlock projections 80 and 82 extend outwardly from the outer side of shell 18. Spaced interlock recesses 84 and 86 extend into the outer side of shell 20. The projections 80 and 82 extending from one assembly 10 fit into the recesses 84 and 86 in an adjacent assembly 10 to lock the assemblies together on DIN rail 12. Recesses 84 are slightly elongated. Projections 80 and 82 fit snuggly in recesses 84 and 86. Projections 80 have a longitudinally loose fit in recesses 86 to accommodate molding tolerances.

A number of lock posts 88 extend outwardly from the inner edge of shell 20. Corresponding lock recesses 90 are provided in the inner edge of shell 18.

The shells 18 and 20 and assembly 22 are put together to form base 10 by positioning one side of circuit board assembly 22 into the interior of one of the shells 18 or 20 with the adjacent edges of upper and lower circuit boards 32 and 30 seated in grooves 70 and 72 respectively and with the rib or projection 76 in groove 70 extending into recess 78 in the adjacent side of the upper circuit board 32.

With the circuit board assembly in place in the grooves in one of the shells, the other shell is moved into engagement with the exposed side of the circuit hoard assembly 22 to fit the other sides of the two circuit boards in grooves 70 and 72 in the other shell. The recess 78 on upper circuit board 32 is located opposite the rib 76 in groove 70 in the second shell. The two shells are then moved together to lock, the posts 88 into recesses 90 with the edges of the circuit boards 30 and 32 fitted in grooves 70 and 72, projections 76 extending into recesses 78 and the inner edges of the shells abutting each other to form body 16.

Figure 3:
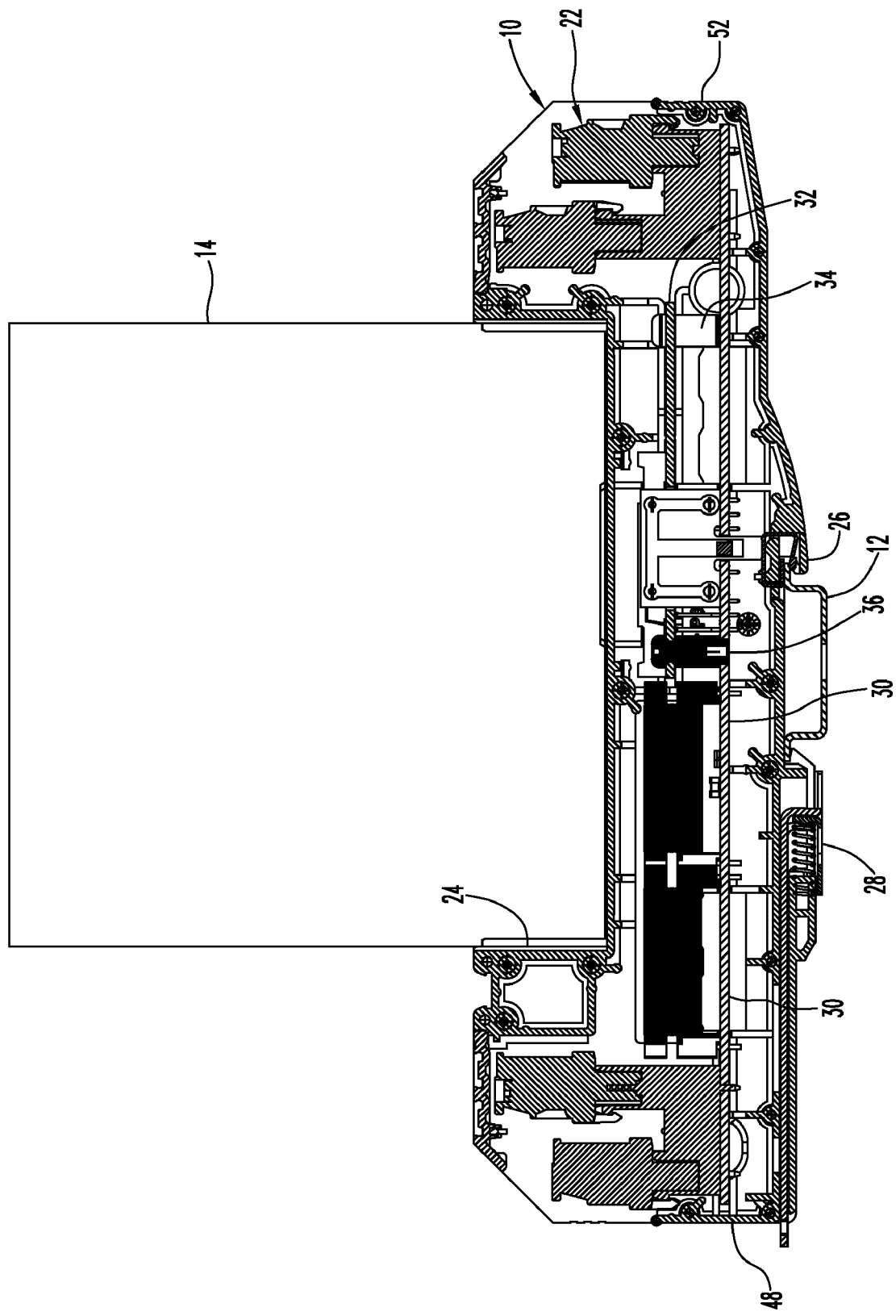
FIG. 3 is a sectional view taken along line 3-3 of FIG. 2.
Figure 4:
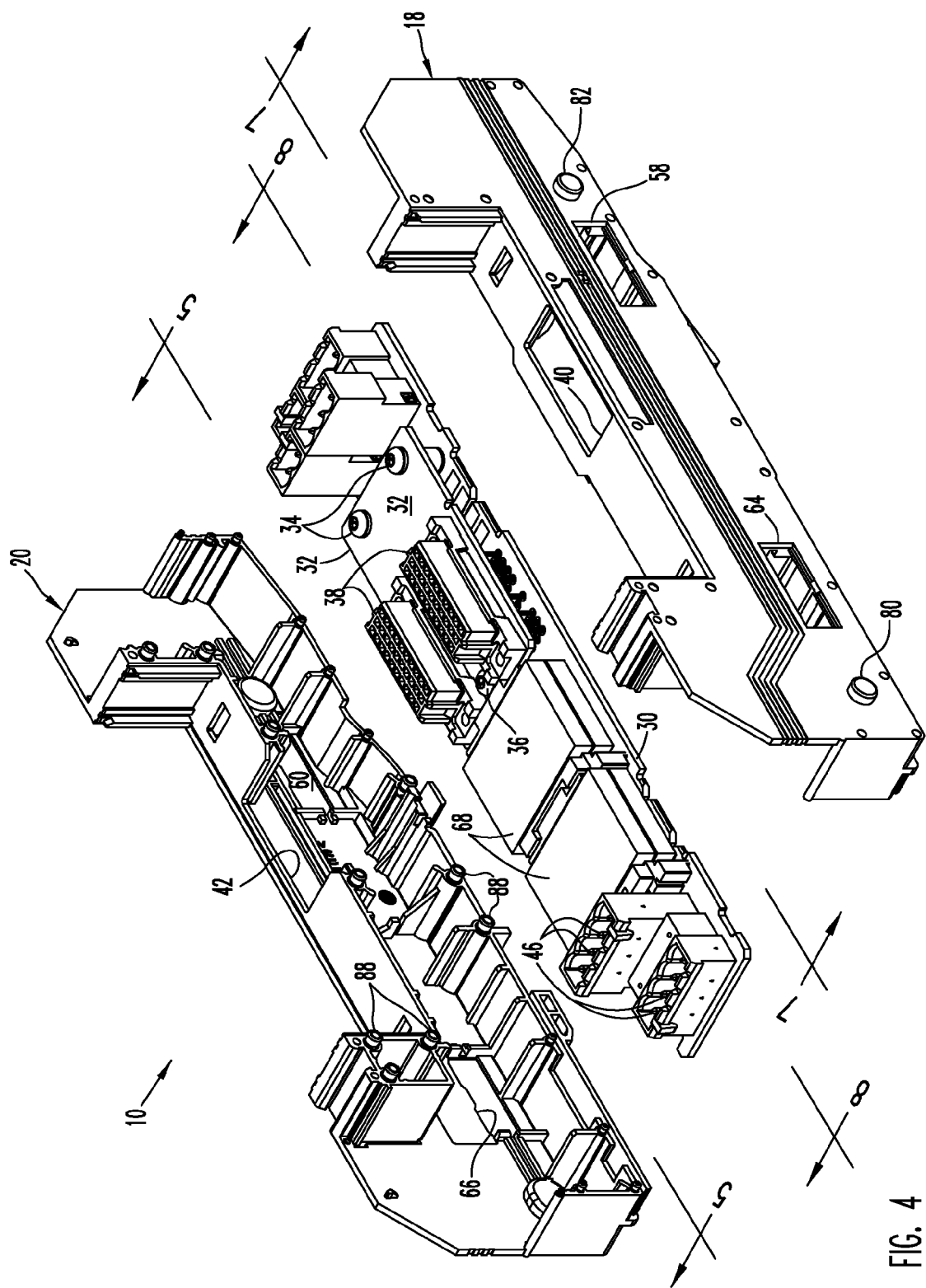
FIG. 4 is an exploded perspective view of the base.

As illustrated in FIGS. 3 and 4, circuit board assembly 22 fully occupies the interior of plastic body 16. The circuit boards extend fully across the width of the body. Circuit board 30 extends between the interior ends of the body. The housings for the outermost pins 46, 47 at one end of the assembly and the outermost pins 46 and 54 on the opposite end of the board are located at the interior ends of the body. This means it is essential that circuit board 30 be accurately located horizontally in lower grooves 70.

The spacer fasteners 34 and 36 accurately locate the upper and lower circuit boards 32 and 30 in correct relation to each other in longitudinal and vertical directions. When the assembly 22 is positioned in plastic body 16, the ribs 76 accurately locate the upper circuit board 32 longitudinally so that the lower circuit board 30 is in a proper longitudinal position in the body with the ends of the lower circuit board, and the components mounted on the lower circuit board, in positions for close fitting within body 16, despite slight dimensional tolerances inherent in the molding of the shells, manufacture of the circuit boards and manufacture and mounting of the components on the circuit boards.

Each base 10 services a process fieldbus connected to pin pairs 46 and 50. One ground bus 57 supplies DC current to one isolation module 14 on the base. The other DC bus 57 supplies DC current to the other isolation module on the base. The isolation buses 57 extend through all of bases 10 mounted on the DIN rail. DC power is supplied, to these buses through wires connected to two pairs of power contact pins 54 in one base 10. The DC voltage of the power supplied, by buses 57 may vary, typically within a range of about 18 volts to about 30 volts. This voltage varies due to factors external to the fieldbus. The modules 14 isolate and regulate the input voltage to generate a steady DC output voltage of about 28 volts. The output voltage from the two modules 14 is combined and the positive voltage output is fed through one decoupling inductor 68 and the ground or negative output is fed through the other decoupling inductor 68. These outputs are then fed to the pins 46 and 50 connected to the fieldbus wiring.

Each isolation module 14 on the base has sufficient capacity to fully power the fieldbus connected to the base 10 independently of the other isolation module on the base. This means that failure of one of the two isolation modules 14 on a base 10 will not affect operation of the fieldbus serviced by the base. The other isolation module will automatically supply power to operate the fieldbus. Also, the modules 14 can be hot-swapped.

Each module 14 includes a normally closed fault relay which is connected to the relay in the other module on the base 10 and to like relays in modules mounted on other bases 10 mounted on the DIN rail 12. The connections between the relays are made through relay contact pads 62 and bridge connectors joining pads 62 on adjacent bases 10.

In the event an isolation module 14 fails and one fault relay opens, the remaining module on the base 10 will continue to serve the fieldbus and an alarm will be actuated to alert an operator to the failure and to initiate investigation and replacement of the failed module 14. The alarm may be in the form of a blinking light or indicator on an operator panel or at a control station.

What I claim as my invention is:

1. A base for a process fieldbus, the base comprising a pair of elongate side-by-side plastic shells joined together to form a body having an elongate interior space with opposed sides, a pair of opposed, parallel upper circuit board grooves extending along said interior sides, a pair of opposed, parallel lower circuit board grooves extending along said interior sides below the upper circuit board grooves; a unitary circuit board assembly comprising an upper circuit board, a lower circuit board under the upper circuit board, and a spacer joined to said upper and lower circuit boards to maintain said circuit boards in a spaced, parallel and fixed relation to each other, each circuit board having opposed and parallel edges; the edges of the upper circuit board in the upper circuit board grooves, the edges of the lower circuit board in the lower circuit board grooves; a first alignment member at one of said circuit board edges, a second alignment member at one of said grooves, said first and second alignment members engaging each other; first contact elements on the circuit board assembly for establishing electrical connections with a process fieldbus; and second contact elements on the circuit board assembly for establishing electrical connections with a DC power source for the fieldbus; wherein said grooves align the circuit board assembly vertically in the body and said alignment members align the circuit board assembly horizontally in the body.

2. The base as in claim 1 wherein the alignment members comprise a first notch and a first rib, the first rib extending into the first notch.

3. The base as in claim 2 including a second notch in an edge of the upper circuit board and a second rib in the groove receiving such edge of the upper circuit board, said second rib extending into said second notch.

4. The base as in claim 3 wherein said first and second contact elements are on the lower circuit board, and said second contact elements are at one end of the lower circuit board.

5. The base as in claim 4 including first and second DC coupling inductors on the lower circuit board.

6. The base as in claim 5, wherein said first and second DC coupling inductors are spaced along the lower circuit board.

7. The base as in claim 3 including a first isolation module for regulating power supplied to said first contact elements from said second contact elements.

8. The base as in claim 7 wherein the isolation module is on said upper circuit board.

9. The base as in claim 8 including a second isolation module on said upper circuit board.

10. The base as in claim 9 wherein said isolation modules are located side-by-side on said upper circuit board.

11. The base as in claim 1 including a DIN rail hook and a DIN rail latch.

12. A base for a process fieldbus, the base comprising;
a hollow body having two opposed members forming an interior space, the body having opposed interior side walls and a first groove extending along each interior side wall, said grooves opposed to each other across the interior of the body and extending parallel to each other;
a first alignment member at one of said grooves;
a unitary circuit board assembly in the hollow body, the circuit board assembly including an upper circuit board, a lower circuit board extending parallel to the upper circuit board, and a spacer/fastener member for securing said circuit boards together, and first contact elements for making electrical connections with a fieldbus, second contact elements for making electrical connections with a power source for the fieldbus, and decoupling inductor means between the first and second contact elements, one circuit board having opposed parallel circuit board edges, and a second alignment member at one of said circuit board edges,
said circuit board edges fitted in said grooves to prevent the circuit board assembly from moving in a direction perpendicular to the grooves, and said alignment members engaging each other to prevent the circuit board assembly from moving in a direction along the grooves,
wherein both circuit boards are positioned in the hollow body.

13. The base as in claim 12 wherein each opposed member comprises a hollow shell.

14. The base as in claim 12 wherein each opposed member includes a second groove extending parallel to said first groove, the edges of the other circuit board extending into such grooves.

15. The base as in claim 12 wherein said first alignment member comprises a rib in said one groove and said second alignment member comprises a recess in said one circuit board edge, said rib extending into said recess.

16. The base as in claim 12 wherein said body includes a module recess for an isolation module, said first circuit board adjacent such recess, an isolation module in the module recess and mounted on the first circuit board, the isolation module regulating power to the first contact elements.

17. The base as in claim 12 wherein the lower circuit board extends the length of the interior space and has opposed ends, said first and said second contact elements on the ends of the lower circuit board.

18. The base as in claim 17 including two decoupling inductors on the lower circuit board to one side of the upper circuit board, and two isolation modules on the upper circuit board.

19. A base for a process fieldbus, the base comprising;
a hollow body having two opposed members forming an interior space;
a unitary circuit board assembly in the hollow body, the circuit board assembly including an upper circuit board, a lower circuit board extending parallel to the upper circuit board, a spacer/fastener member for securing said circuit boards together, and first contact elements for making electrical connections with fieldbus wiring outside the base, second contact elements for making electrical connections with power source wiring outside the base, and decoupling inductors between the first and second contact elements;
a first connection between one of said circuit boards and one member to locate the assembly vertically in the interior space,
a second connection between one of said circuit boards and one member to locate the assembly horizontally in the interior space,
wherein both circuit boards are vertically and horizontally located in the interior space and the contact elements are at desired locations for engaging fieldbus wiring and power source wiring.

20. The base as in claim 19 wherein one connection includes either a groove on an interior surface of one member or a projection on the interior surface of one member.

21. The base as in claim 19 wherein the first and second connections are at the same circuit board.

22. The base as in claim 19 wherein the first and second connections are at the upper circuit board.

* * * * *

UNITED STATES PATENT AND TRADEMARK OFFICE
CERTIFICATE OF CORRECTION

PATENT NO. : 8,379,398 B2  Page 1 of 1
APPLICATION NO. : 13/069527
DATED : February 19, 2013
INVENTOR(S) : Correll et al.

It is certified that error appears in the above-identified patent and that said Letters Patent is hereby corrected as shown below:

In the Claims:

Column 6, line 10, replace "first" with --upper--.

Column 6, line 12, replace "first" with --upper--.

Signed and Sealed this
Twenty-sixth Day of May, 2015

Michelle K. Lee
*Director of the United States Patent and Trademark Office*